(12) United States Patent
Kim et al.

(10) Patent No.: US 8,610,401 B2
(45) Date of Patent: Dec. 17, 2013

(54) TELEMATICS DEVICE FOR REMOTE CHARGING CONTROL AND METHOD OF PROVIDING SERVICE THEREOF

(75) Inventors: Sung Yun Kim, Jeju-Do (KR); Ji-Hwon Kim, Gyeonggi-Do (KR); Hyun Cheol Bae, Gyeonggi-Do (KR); Hun Joung Yoon, Gyeonggi-Do (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 433 days.

(21) Appl. No.: 12/950,272

(22) Filed: Nov. 19, 2010

(65) Prior Publication Data

US 2012/0086395 A1    Apr. 12, 2012

(30) Foreign Application Priority Data

Oct. 12, 2010 (KR) .................. 10-2010-0099521

(51) Int. Cl.
*H02J 7/00* (2006.01)
*B60K 1/00* (2006.01)

(52) U.S. Cl.
USPC ....... 320/109; 180/65.1; 180/65.21; 705/14.1

(58) Field of Classification Search
USPC ....................................................... 320/109
See application file for complete search history.

(56) References Cited

U.S. PATENT DOCUMENTS

| 5,596,261 A * | 1/1997 | Suyama .................. 320/152 |
| 7,582,979 B2 * | 9/2009 | Oyobe et al. .............. 290/1 R |
| 2006/0284593 A1 * | 12/2006 | Nagy et al. ............... 320/109 |
| 2009/0091291 A1 * | 4/2009 | Woody et al. ............. 320/109 |
| 2009/0302801 A1 | 12/2009 | Katsunaga |
| 2009/0313098 A1 * | 12/2009 | Hafner et al. ............. 705/14.1 |
| 2010/0161481 A1 * | 6/2010 | Littrell .................... 705/40 |
| 2010/0161482 A1 * | 6/2010 | Littrell .................... 705/40 |

FOREIGN PATENT DOCUMENTS

| JP | 2004-048900A A | 2/2004 |
| JP | 2007-148590 A | 6/2007 |
| JP | 2009-176150 A | 8/2009 |
| KR | 1997-047524 U | 7/1997 |
| KR | 10-2007-0071672 A | 7/2007 |
| KR | 1020090115585 A | 11/2009 |
| KR | 1020090127234 A | 12/2009 |
| KR | 10-2010-0044154 A | 4/2010 |
| WO | 2009/089249 A1 | 7/2009 |
| WO | 2009/098687 A2 | 8/2009 |
| WO | 2010/037790 A1 | 4/2010 |

* cited by examiner

*Primary Examiner* — Yalkew Fantu
(74) *Attorney, Agent, or Firm* — Edwards Wildman Palmer LLP; Peter F. Corless

(57) ABSTRACT

An electric vehicle is provided. A driver can remotely monitor battery charging associated operations and control a necessary function, thereby improving convenience of the driver of the electric vehicle.

15 Claims, 4 Drawing Sheets

TELEMATICS DEVICE FOR REMOTE CHARGING CONTROL AND METHOD OF PROVIDING SERVICE THEREOF

CROSS-REFERENCE TO RELATED APPLICATION

This application claims under 35 U.S.C. §119(a) the benefit of Korean patent application No. 10-2010-0099521 filed on Oct. 12, 2010, the disclosure of which is hereby incorporated in its entirety by reference.

BACKGROUND OF THE INVENTION

Embodiments of the present invention relate to an electric vehicle, and more particularly to a telematics device of an electric vehicle which is able to remotely monitor battery charging associated operations of the electric vehicle and to remotely control a necessary function, and a method of providing a service thereof.

Recently, an electric vehicle using electricity has been developed and marketed. Such an electric vehicle is driven using electricity stored in a battery mounted therein. The electric vehicle is advantageous in that noise is minimized and exhaust gases are not discharged, thereby protecting the environment.

Since such an electric vehicle uses a large-capacity battery, it takes considerable time to charge the battery. In general, six to eight hours are consumed in case of low-speed charging.

As a method of checking a charging state while charging is performed, a method of enabling a driver to directly approach a vehicle so as to check the charging state was used in the related art.

However, since charging is mainly performed at night, the method of the related art results in user inconvenience.

The above information disclosed in this Background section is only for enhancement of understanding of the background of the invention and therefore it may contain information that does not form the prior art that is already known in this country to a person of ordinary skill in the art.

BRIEF SUMMARY OF THE INVENTION

Therefore, the present invention has been made in view of the above problems, and it is an object of the present invention to provide convenience to a driver by remotely monitoring a charging state of a vehicle and controlling the charging of a battery.

In accordance with an aspect of the present invention, a telematics device of an electric vehicle includes a battery management unit configured to measure a battery charging state and to output battery charging information, a wireless communication unit configured to transmit and receive data according to a predefined communication protocol, and a control unit configured to receive the battery charging information from the battery management unit when the battery is charged and to transmit the battery charging information to a predetermined server through the wireless communication unit.

In the telematics device of the electric vehicle according to the present invention, the battery management unit may be automatically turned off if the charging of the battery is finished. The battery management unit may measure a charging current amount, compute a State of Charge (SOC) of the battery and a charging completion time, and output the computed results to the control unit.

In the telematics device of the electric vehicle according to the present invention, the battery management unit may transmit a charging start signal to the control unit when the charging of the battery is started and output a charging end signal to the control unit if the charging of the battery is finished. If the charging start signal or the charging end signal is received, the control unit may transmit the charging start signal or the charging end signal to the server.

In the telematics device of the electric vehicle according to the present invention, the battery management unit may output an alarm signal indicating that the charging of the battery is impossible to the control unit.

In the telematics device of the electric vehicle according to the present invention, the control unit may compute a travelable distance corresponding to a charging amount and transmit information about the computed travelable distance and the battery charging information.

In the telematics device of the electric vehicle according to the present invention, if destination information is received, the control unit may compute a distance to the destination, compare the computed distance with the travelable distance, and stop a charging operation of the battery management unit if the battery is charged by the amount of power necessary for traveling to the destination. Alternatively, if destination information is received, the control unit may compare a distance to the destination received from the server with the travelable distance, and stop a charging operation of the battery management unit if the battery is charged by the amount of power necessary for traveling to the destination.

In the telematics device of the electric vehicle according to the present invention, if charging reservation information is set, the control unit may stop the charging of the battery management unit until reaching a reserved time.

In accordance with another aspect of the present invention, a method of providing a remote charging control service of an electric vehicle includes acquiring battery charging information when a battery is charged, computing travelable distance according to the battery charging information, and transmitting the battery charging information and information about the travelable distance to a predetermined sever.

The method according to the present invention may further include transmitting an alarm signal to the server, when a situation in which the charging of the battery is impossible occurs.

In the method according to the present invention, the acquiring of the battery charging information may include measuring a charging current amount, computing a State of Charge (SOC) of the battery and a charging completion time, checking whether charging reservation information is present before the charging of the battery, and starting the charging of the battery when reaching a reserved time, if the charging reservation information is present.

In the method according to the present invention, the computing of the travelable information may include computing the travelable distance using predetermined mileage information and charging amount information of the charging information.

The method according to the present invention may further include, if destination information is received, comparing a distance to the destination with the travelable distance and charging the battery by the amount of power necessary for traveling to the destination.

DESCRIPTION OF EMBODIMENTS

Hereinafter reference will now be made in detail to various embodiments of the present invention, examples of which are illustrated in the accompanying drawings and described below. While the invention will be described in conjunction with exemplary embodiments, it will be understood that present description is not intended to limit the invention to those exemplary embodiments. On the contrary, the invention is intended to cover not only the exemplary embodiments, but also various alternatives, modifications, equivalents and other embodiments, which may be included within the spirit and scope of the invention as defined by the appended claims.

Figure 1:
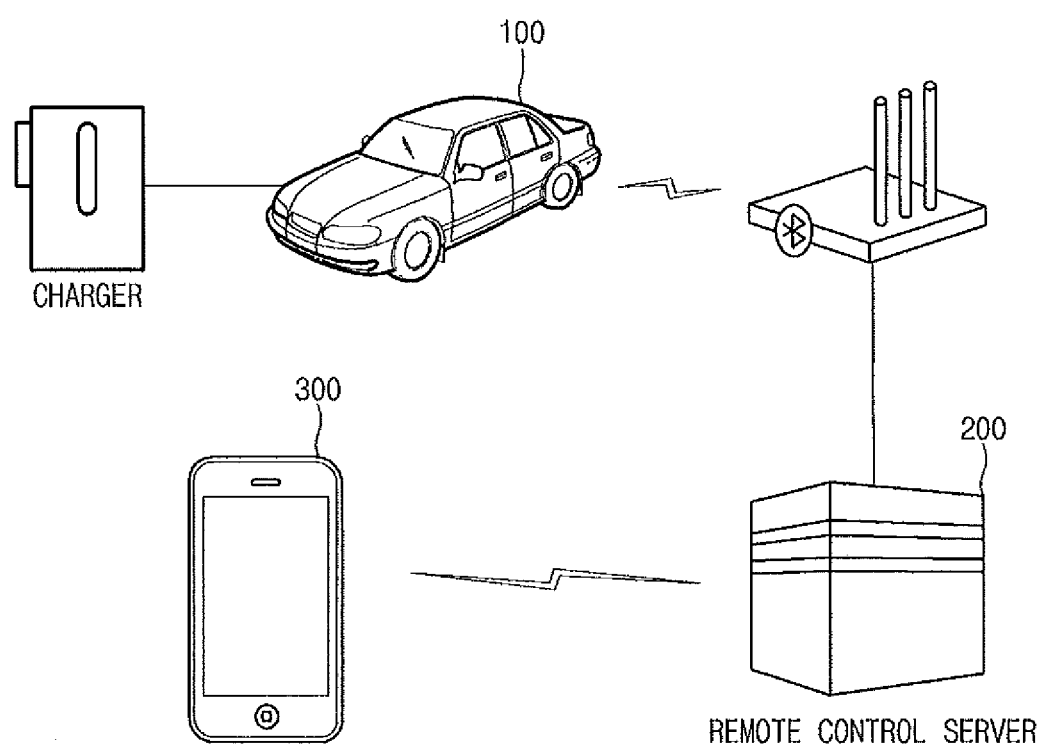
FIG. 1 is a diagram showing the overall configuration of a remote control system of an electric vehicle of an embodiment of the present invention.

FIG. 1 is a diagram showing the overall configuration of a remote control system of an electric vehicle of an embodiment of the present invention.

The system of FIG. 1 includes a telematics device 100 of a vehicle, a control server 200, and a remote terminal 300.

The telematics device 100 is mounted in an electric vehicle so as to perform wireless communication with the control server 200 through an Access Point (AP) mounted in a charging station or a mobile communication (CDMA or WCDMA) network when the electric vehicle enters the charging station. The telematics device 100 transmits a charging start signal and a charging end signal to the control server 200 when the charging of a battery is started or finished. While the battery is charged, the telematices device 100 transmits a State of Charge (SOC) of the battery, a charging completion time, information about travelable distance using a current charging amount and information about an event occurred during charging (e.g., a situation in which a charging plug is pulled out and thus charging of the battery cannot be performed) to the control server 10 over a wireless communication network. The telematics device 100 automatically performs reserved charging at a reserved time when receiving reservation information from the control server 200. In addition, the telematics device 100 computes and stores the amount of power used in, e.g., a daily, weekly, monthly, or yearly unit, the power rate thereof, and mileage (traveling distance per power), and provides the information according to a driver's request.

The control server 200 stores and manages information about the electric vehicle and the driver, and transmits information received from the telematics device 100 to the remote terminal 300 registered in correspondence with the electric vehicle over a wired/wireless communication network. That is, the control server 200 transmits an alarm signal to the remote terminal 300 in real time when event information is received and enables the driver to check battery charging information of the vehicle using the remote terminal 300. The control server 200 receives a remote control signal from the remote terminal 300 and transmits the remote control signal to the telematics device 100 of the electric vehicle corresponding to the remote terminal 300.

The remote terminal 300 is a driver's terminal which accesses the control server 200 by executing an application interlocked with the control server 200 so as to enable the driver to monitor the battery charging information of the vehicle. The remote terminal 300 generates a remote control signal according to key manipulation of the driver and transmits the remote control signal to the telematics device 100 through the control server 200. The remote terminal 300 may include all terminals (e.g., a PC, a smart phone, a PDA, a PMP, etc.) which can access the control server 200 over a wired/wireless communication network (Ethernet, WIBRO, WIFI, RF communication, etc.)

Figure 2:
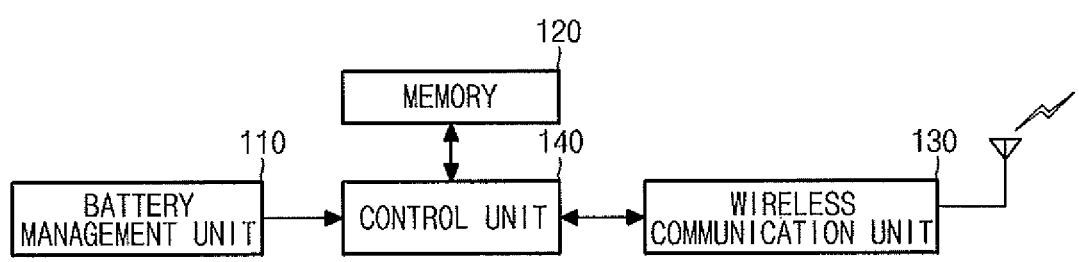
FIG. 2 is a diagram showing the configuration of a telematics device mounted in the vehicle shown in FIG. 1.

FIG. 2 is a diagram showing the configuration of the telematics device 100 of FIG. 1.

The telematics device 100 includes a battery management unit 110, a memory 120, a wireless communication unit 130, and a control unit 140.

The battery management unit 110 manages all the states associated with the charging of the battery. The battery management unit 110 transmits a charging start signal and a charge end signal to the control unit 140 when the charging of the battery is started or finished. While the battery is charged, the battery management unit 110 measures a charging current amount, computes the SOC of the battery and the charging completion time, and transmits the SOC of the battery and the charging completion time to the control unit 140. If a situation in which the charging plug is pulled out or a problem occurs in the battery such that the charging cannot be performed occurs during charging, the battery management unit 110 generates an alarm signal indicating the situation to the control unit 140. The battery management unit 110 is automatically turned off if the charging is finished and is turned on when the charging is restarted or when an instruction of the control unit 140 is received.

The memory 120 stores the amount of power (total amount of power or average amount of power) used in a predetermined period unit (e.g., yearly, monthly, weekly, or daily unit), the power rate thereof, mileage (traveling distance per power), information about the amount of power consumed in devices mounted in the vehicle, map information and reservation information.

The wireless communication unit 130 transmits and receives data to and from the control server 200 over wireless communication network according to a predefined communication protocol. The wireless communication unit 130 may transmit and receive data using a wireless communication technology such as a mobile communication technology (CDMA, WCDMA, etc.), a wireless Internet (WIBRO, WIFI, etc.) technology, a Local Area Network (LAN) communication technology (Bluetooth, RFID, IrDA, ZigBee, etc.).

The control unit 140 controls the operation of the telematics device 100 and receives battery charging information (the SOC of the battery and the charging completion time) and event generation information from the battery management unit 110 and transmits the battery charging information and the event generation information to the control server 200 through the wireless communication unit 130. The control unit 140 computes the travelable distance using the power of the battery charged up to now using mileage information and transmits the traveling distance and the battery charging information to the control server 200 through the wireless communication unit 130. In particular, the control unit 140 computes the travelable distance when a device or devices (a light, a wiper, an air conditioner, a heater, and the like) other than a traveling motor are used and supplies the travelable distance to the remote terminal 300 through the control server 200. For example, if the driver selects a device(s) (a light and a heater) to be used during traveling using the remote terminal 300 and requests the computation of the travelable distance, the control unit 140 computes the travelable distance using information about a current battery charging amount, information about the mileage of the motor, and information about a power consumption amount of the device(s) selected by the driver, and supplies the computed result to the remote terminal 300 through the control server 200. In addition, when the driver provides a destination using the remote terminal 300, the control unit 140 computes a distance to the destination using map information, compares the computed distance with the travelable distance, stops the charging operation of the battery management unit 110 if the battery is charged by the amount of power necessary for reaching the destination, and informs the remote terminal 300 that the charging is finished through the control server 200. If the battery charging time is reserved, the control unit 140 delays the charging of the battery management unit 110 up to the reserved time so as to perform the charging operation only at the reserved time. Thus, it is possible to perform the charging operation at a cheaper midnight power rate.

Figure 3:
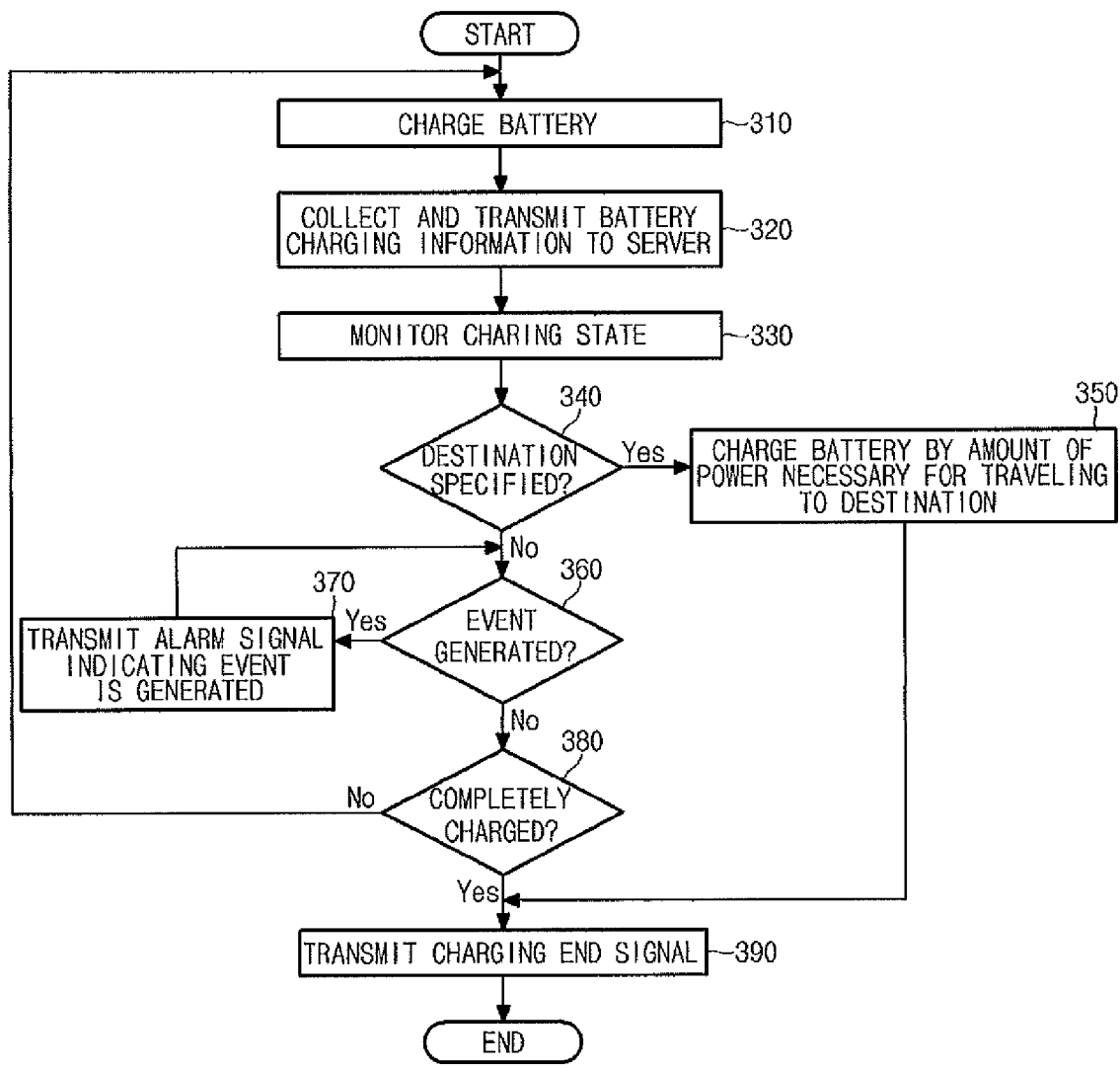
FIG. 3 is a flowchart illustrating a method of providing a remote charging control service using the telematics device of FIG. 2.

FIG. 3 is a flowchart illustrating a method of providing a remote charging control service using the telematics device 100 having the above configuration.

When the electric vehicle enters a charging station, the telematics device 100 mounted in the electric vehicle performs communication with the control server 200 over the wireless communication network according to a predefined communication protocol.

In a wireless communication method, communication with the control server 200 is performed through, e.g., an AP or a mobile communication (CDMA, WCDMA, or WIBRO) repeater (base station).

Since it takes considerable time (in case of low-speed charging, about 6 to 8 hours) to charge the electric vehicle, the driver who requests the charging of the electric vehicle to the charging station may put the electric vehicle in the charging station and go to the driver's home or office.

If a charging plug is put into the vehicle in the charging station, the battery management unit 110 transmits the charging start signal to the control unit 140 and begins to charge the battery if a charging standby signal is not received from the control unit 140 (step 310).

The control unit 140 which receives the charging start signal checks reservation information stored in the memory 120, outputs the charging standby signal to the battery management unit 110 if the charging time is reserved, and stops the charging operation until the reserved time is reached. However, if the reservation information is not present, the control unit 140 transmits a signal indicating that the charging of the battery is started to the control server 200 through the wireless communication unit 130. Then, the control server 200 transmits the signal indicating that the charging of the battery is started to the remote control terminal 300, for example, a smart phone, of the driver corresponding to the electric vehicle.

While the battery is charged, the control unit 140 receives the battery charging information (the SOC of the battery and the charging completion time) from the battery management unit 110 and transmits the battery charging information to the control server 200 (step 320), That is, the battery management unit 110 measures the charging current amount of the battery, computes the SOC of the battery and the charging completion time, and transmits the computed values to the control unit 140. Then, the control unit 140 transmits the information about the SOC of the battery and the charging completion time to the control server 200. The control unit 140 computes the travelable distance corresponding to the current charging amount using the mileage information and the charging amount stored in the memory 120 and transmits the information about the travelable distance and the battery charging information to the control server 200.

Figure 4:
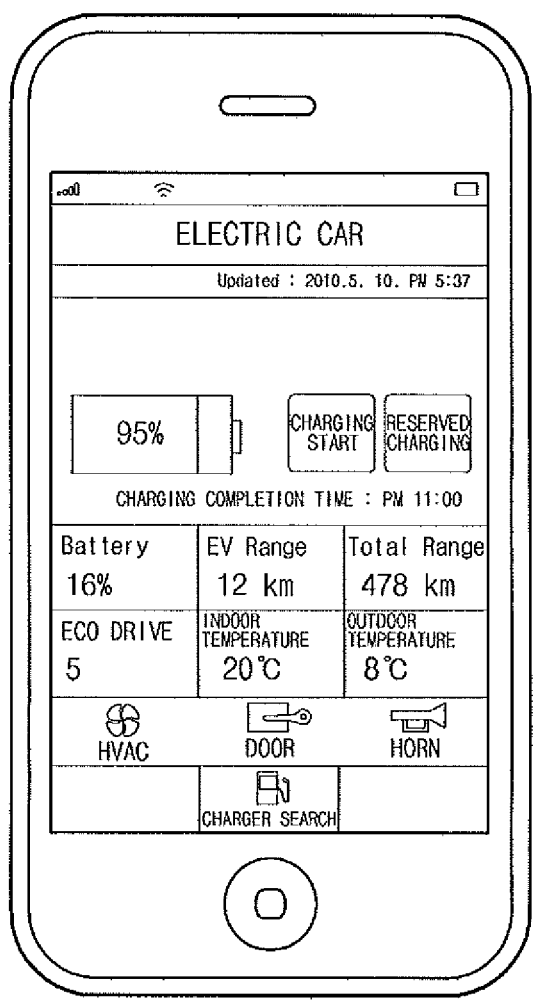
FIG. 4 is a diagram showing a remote control terminal (smart phone), on which charging information and temperature information are displayed, according to an embodiment of the present invention.

When the driver selects a menu of the remote terminal 300 in order to check the charging state of the vehicle, the remote terminal 300 executes an application interlocked with the remote control server 200 so as to access the control server 200, receives information about the SOC of the battery, the charging completion time and the travelable distance from the control server 200, and displays the information on a screen as shown in FIG. 4, such that the driver monitors the information (step 330).

If the driver specifies a destination in a charging control menu of the remote terminal 300 in order to charge the battery only by the amount of power necessary for traveling to the destination without completely charging the battery, the remote terminal 300 transmits destination information to the control unit 140 of the telematics device 100 through the control server 200 (step 340).

The control unit 140 which receives the destination information computes a distance to the destination using the map information stored in the memory 120, compares the computed distance with the travelable distance computed in step 320, stops the charging operation of the battery management unit 110 if the battery is charged by the amount of power necessary for traveling to the destination (step 350), and informs the remote terminal 300 that the charging is finished through the control server 200 (step 390).

Alternatively, the control server 200 may compute the distance to the destination using the map information, and the control unit 140 may receive only the computed distance from the control server 200 and perform the above-described operation.

When the driver specifies a destination and selects a device(s) (e.g., a light, a wiper, an air conditioner, a heater, etc.) in the vehicle to be operated during traveling, the control unit 140 determines the charging amount in consideration of the amount of power consumed by the device(s) during traveling.

If the driver cannot travel to the specified destination while driving the device(s) selected by the driver even in a state in which the battery is completely charged, the control unit 140 may inform the remote terminal 300 that the driver cannot travel to the specified destination while driving the device(s), and display a message indicating that the use of the device(s) (e.g., an air conditioner or a heater) consuming a large amount of power should be restricted on the screen of the remote terminal 300. In addition, the control unit 140 may detect information about charging stations near a path to the destination and transmit the information to the remote terminal 300.

If the driver does not specify the destination in step S340, the control unit 140 checks whether or not event information indicating the charging of the battery is impossible is received from the battery management unit 110 (step 360).

If the event is generated, the control unit 140 transmits an alarm signal indicating that the event is generated to the remote terminal 300 through the control server 200 (step 370).

If the event is not generated, the battery management unit 110 performs the charging operation until the battery is completely charged (step 380).

If the charging is finished, the battery management unit 110 transmits a charging end signal to the control unit 140, and the control unit 140 transmits the charging end signal to the remote terminal 300 through the control server 200 (step 390).

Although it is described in the above-mentioned embodiments that a smart phone can be used as a terminal, the other terminals such as a Personal Computer (PC) still can be used, and then the remote monitoring and control can be used through a web-page received from the remote control server 200. In addition, although it is described in the above-mentioned embodiments that the driver can monitor the vehicle charging state and perform the remote control function, the control unit 140 still can perform.

The detailed description of the exemplary embodiments of the present invention has been given to enable those skilled in the art to implement and practice the invention. Although the invention has been described with reference to the exemplary embodiments, those skilled in the art will appreciate that various modifications and variations can be made in the present invention without departing from the spirit or scope of the invention described in the appended claims. For example, those skilled in the art may use each construction described in the above embodiments in combination with each other.

What is claimed is:

1. A telematics device of an electric vehicle, comprising:
    a battery management unit configured to measure a charging state of a battery and to output battery charging information;
    a wireless communication unit configured to transmit and receive data according to a predefined communication protocol; and
    a control unit configured to receive the battery charging information from the battery management unit when the battery is charged and to transmit the battery charging information to a predetermined server through the wireless communication unit,
    wherein, if information regarding a destination is received, the control unit computes a distance to the destination and stops a charging operation of the battery management unit if the battery is charged by an amount of power necessary for traveling to the destination.

2. The telematics device according to claim 1, wherein the battery management unit measures a charging current amount, computes a State of Charge (SOC) of the battery, and a charging completion time, and outputs the computed results to the control unit.

3. The telematics device according to claim 1, wherein the battery management unit transmits a charging start signal to the control unit when the charging of the battery is started and outputs a charging end signal to the control unit if the charging of the battery is finished.

4. The telematics device according to claim 3, wherein, if the charging start signal or the charging end signal is received, the control unit transmits the charging start signal or the charging end signal to the server.

5. The telematics device according to claim 1, wherein the battery management unit outputs an alarm signal indicating that the charging of the battery is impossible to the control unit.

6. The telematics device according to claim 1, wherein the control unit computes a travelable distance corresponding to a charging amount and transmits information about the computed travelable distance and the battery charging information.

7. The telematics device according to claim 6, wherein, the control unit computes the travelable distance based on a power consumption amount of a device.

8. The telematics device according to claim 6, wherein, if the destination information is received, the control unit compares the distance to the destination received from the server with the travelable distance, and stops the charging operation of the battery management unit if the battery is charged by the amount of power necessary for traveling to the destination.

9. The telematics device according to claim 1, wherein, if charging reservation information is set, the control unit stops the charging of the battery management unit until reaching a reserved time.

10. A method of providing a remote charging control service of an electric vehicle, the method comprising the steps of:
    acquiring battery charging information when a battery is charged;
    computing a travelable distance according to the battery charging information;
    transmitting the battery charging information and information about the travelable distance to a predetermined server; and
    if information regarding a destination is received, comparing a distance to the destination with the travelable distance, and charging the battery by an amount of power necessary for traveling to the destination.

11. The method according to claim 10, further comprising the step of:
    transmitting an alarm signal to the server, when a situation in which the charging of the battery is impossible occurs.

12. The method according to claim 10, wherein the step of acquiring the battery charging information includes measuring a charging current amount, and computing a State of Charge (SOC) of the battery, and a charging completion time.

13. The method according to claim 10, wherein the step of acquiring the battery charging information includes checking whether charging reservation information is present before charging of the battery, and starting the charging of the battery when reaching a reserved time, if the charging reservation information is present.

14. The method according to claim 10, wherein the step of computing the travelable information includes computing the travelable distance using predetermined mileage information and charging amount information of the charging information.

15. The method according to claim 10, wherein the travelable distance is computed based on a power consumption amount of a device.

* * * * *